United States Patent
Lai et al.

[11] Patent Number: 6,083,829
[45] Date of Patent: Jul. 4, 2000

[54] USE OF A LOW RESISTIVITY CU₃GE INTERLAYER AS AN ADHESION PROMOTER BETWEEN COPPER AND TIN LAYERS

[75] Inventors: Jane-Bai Lai, Hsin-Chu; Lih-Juann Chen; Chung-Shi Liu, both of Hsinchu; Chen-Hua Douglas Yu, Hsin-Chu, all of Taiwan

[73] Assignee: Taiwan Semiconductor Manufacturing Company, Hsin-Chu, Taiwan

[21] Appl. No.: 09/083,419

[22] Filed: May 22, 1998

[51] Int. Cl.⁷ .................................................. H01L 21/4763
[52] U.S. Cl. ......................... 438/643; 438/644; 438/661; 438/674; 438/687
[58] Field of Search ..................... 438/687, 674, 438/644, 685, 678, 643, 661

[56] References Cited

U.S. PATENT DOCUMENTS

| | | | |
|---|---|---|---|
| 3,623,961 | 11/1971 | van Laer | 204/15 |
| 5,283,206 | 2/1994 | Sugano | 438/658 |
| 5,292,393 | 3/1994 | Maydan et al. | 156/345 |
| 5,391,517 | 2/1995 | Gelatos et al. | 437/190 |
| 5,420,069 | 5/1995 | Joshi et al. | 437/187 |
| 5,512,163 | 4/1996 | Warfield | 205/109 |
| 5,529,954 | 6/1996 | Iijima et al. | 437/189 |
| 5,677,244 | 10/1997 | Venkatraman | 438/643 |
| 5,695,810 | 12/1997 | Dubin et al. | 427/96 |
| 5,933,758 | 8/1999 | Jain | 438/687 |

*Primary Examiner*—Olik Chaudhuri
*Assistant Examiner*—Kurt Eaton
*Attorney, Agent, or Firm*—George O. Saile; Stephen B. Ackerman

[57] ABSTRACT

A method for fabricating a copper interconnect structure, using a low resistivity Cu₃Ge intermetallic layer, as an adhesive layer, has been developed. Following an in situ, CVD of a titanium nitride barrier layer, a germanium layer, and a copper layer, an anneal procedure is used to form the Cu₃Ge intermetallic layer, with the intermetallic layer, located between the underlying titanium nitride barrier layer, and the overlying copper layer. The Cu₃Ge intermetallic layer can also be formed in situ, during deposition, if the deposition temperature exceeds 150° C. Cu₃Ge layer exhibits a resistivity of about 5E-6 ohm - cm. A second iteration of this invention allows a thick copper layer to be plated on a thin copper seed layer, only on the top surface of a semiconductor substrate. This iteration, also incorporating the low resistivity, Cu₃Ge intermetallic, and the adhesive layer, prevents copper from being plated on the beveled edge of the semiconductor substrate.

26 Claims, 3 Drawing Sheets

USE OF A LOW RESISTIVITY CU₃GE INTERLAYER AS AN ADHESION PROMOTER BETWEEN COPPER AND TIN LAYERS

BACKGROUND OF THE INVENTION

1. Field of the Invention

The present invention relates to a method used to create metal interconnect structures, for semiconductor devices, and more specifically to a method used to improve the adhesion of a copper layer, used as a component of the metal interconnect structure, to underlying surfaces.

2. Description of Prior Art

The objectives of the semiconductor industry is to continually improve performance of semiconductor devices, while still attempting to decrease the cost of these same semiconductor devices. Micro-miniaturization, or the ability to create semiconductor devices with sub-micron features, have allowed the performance and cost objectives to be successfully addressed. For example smaller features result in a decrease in performance degrading capacitances and resistances, for device regions in the semiconductor substrate. In addition the use of sub-micron features, allow smaller semiconductor chips to be realized, however still possessing device density comparable to densities achieved with larger semiconductor chip counterparts. This allows more chips to be realized from a specific size starting substrate, thus reducing the processing cost for a specific semiconductor chip.

One area in which micro-miniaturization has adversely influenced performance, is the metal interconnect structures. Although the resistance of metal interconnect structures is reduced by the decreasing lengths of the metal runs, a reduction in the thickness of the metal lines, necessitated in order to reduce topography, results in resistance increases for the thinner metal lines. One solution for higher resistance, thinner metal interconnect structures, is the use of lower resistivity, copper interconnect structures, in place of the higher resistivity, aluminum based, interconnect structures. The use of copper interconnect structures, however, introduce several new concerns, that were not relevant with the aluminum based metallization. First, copper must be separated from underlying dielectric layers, or from semiconductor regions, due to the interaction of copper with insulator or silicon layers. Therefore barrier layers are used, underlying copper layers, preventing the deleterious effects of copper in silicon, or in silicon oxide layers. In addition the adhesion between copper and underlying barrier layers is not as strong as the adhesion between aluminum and underlying dielectric materials, therefore an adhesion layer is sometimes added to metal interconnect structures, in which copper is used as the major conductive component.

Prior art, such as Gelatos, et al, in U.S. Pat. No. 5,391,517, describe an interconnect structure, using copper as the main current carrying component, in which a layer of titanium nitride is used as a barrier layer, to prevent unwanted copper from entering underlying materials. This prior art also uses a titanium-copper, intermetallic layer, placed between the copper layer, and the underlying titanium nitride layer, to improve copper adhesion to underlying materials. The present invention will describe a novel process of forming a copper-germanium, ($Cu_3Ge$), intermetallic layer, to be used as an adhesive layer for copper. The advantages of the $Cu_3Ge$ adhesive layer is a lower resistivity than counterpart adhesive layers, thus positively influencing performance. In addition the process used for this novel intermetallic adhesion layer, can be simplified via the use of a cluster tool for in situ deposition of the titanium nitride barrier layer, as well as for the deposition of both copper and germanium layers.

SUMMARY OF THE INVENTION

It is an object of this invention to use copper for low resistance, interconnect structures.

It is another object of this invention to use a $Cu_3Ge$ intermetallic layer, to improve the adhesion between copper and underlying materials.

It is still another object of this invention to deposit a titanium nitride barrier layer, a germanium layer, and a copper layer, in the same physical vapor deposition/chemical vapor deposition, (PVD/CVD), cluster tool.

It is yet another object of this invention to use a CVD, copper seed layer, on an underlying $Cu_3Ge$ intermetallic adhesion layer, followed by the plating of a thick copper layer, on the surface of the copper seed layer, using a electro-chemical deposition, (ECD), procedure.

In accordance with the present invention, a method is described for forming copper interconnect structures, for semiconductor devices, using a $Cu_3Ge$ intermetallic layer, to provide adhesion of copper to underlying materials. A semiconductor substrate, with exposed surfaces comprised of dielectric materials, and semiconductor materials, is provided. A first embodiment of this invention encompasses the deposition of a titanium nitride barrier layer, a germanium layer, and a thick copper layer, using a single physical chemical vapor deposition, cluster tool. If the copper layer is deposited at a temperature below 150° C., an anneal is performed to create a $Cu_3Ge$ intermetallic layer, on the underlying titanium nitride layer, consuming all of the germanium layer, and a portion of the overlying thick copper layer, resulting in the desired conductive, interconnect composite layer, comprised of thick copper, overlying the low resistivity layer of $Cu_3Ge$, on a titanium nitride barrier layer. However if the copper layer is deposited at a temperature greater than 150° C., the $Cu_3Ge$ intermetallic layer will form in situ, during the copper deposition, removing the need of the anneal procedure.

A second embodiment of this invention allows a thick copper layer to be plated only on the exposed surface of a copper seed layer, wherein the copper seed layer overlays a $Cu_3Ge$ intermetallic layer, and with the copper seed layer residing only on the top surface of a silicon wafer, thus avoiding copper plating at the beveled edge of the silicon wafer. A composite layer of titanium nitride, germanium, and thin copper, is deposited in a cluster, PVD/CVD tool. The thin copper seed layer does not extend to the beveled edge of the silicon wafer, therefore exposing the top surface of the germanium layer, at the beveled edge of the silicon wafer. An electrochemical deposition, (ECD), procedure is than used to plate a thick copper layer, only on the top surface of the thin copper seed layer. The ECD procedure will only partially plate on titanium nitride, while not plating at all, on germanium surfaces. For both embodiments, patterning of the metal composite layer, comprised of copper, $Cu_3Ge$, and titanium nitride, is performed via either a copper damascene procedure, featuring a copper chemical mechanical polishing procedure, or via a photolithographic and anisotropic reactive ion etching procedure, creating the copper interconnect structure.

BRIEF DESCRIPTION OF THE INVENTION

The object and other advantages of this invention are best described in the preferred embodiment with reference to the drawings that include:

FIGS. 1–3, which schematically, in cross-sectional style, show the stages of formation of a copper interconnect structure, featuring the $Cu_3Ge$ intermetallic, adhesion layer.

FIGS. 4–6, which schematically, in cross-sectional style, show the stages of fabrication, used to form a thick copper interconnect structure only on the top surface of a semiconductor substrate, avoiding thick copper deposition on the beveled edges of a silicon wafer.

DESCRIPTION OF THE PREFERRED EMBODIMENTS

The method of fabricating a copper interconnect structure, featuring a $Cu_3Ge$ intermetallic layer, to improve adhesion between copper, and underlying materials, will now be described in detail. The use of interconnect structures, using copper as the major conductive component, and using a low resistivity $Cu_3Ge$ intermetallic layer for adhesion purposes, can be used for any level of metal interconnect, such as a first level interconnect structure, either directly contacting underlying active device regions, in a semiconductor substrate, or contacting a conductive plug, which in turn contacts underlying semiconductor device regions, or contacts other metal interconnect structures. The copper interconnect structure of this invention can also be used for upper levels of metal interconnect structures.

Figure 1:
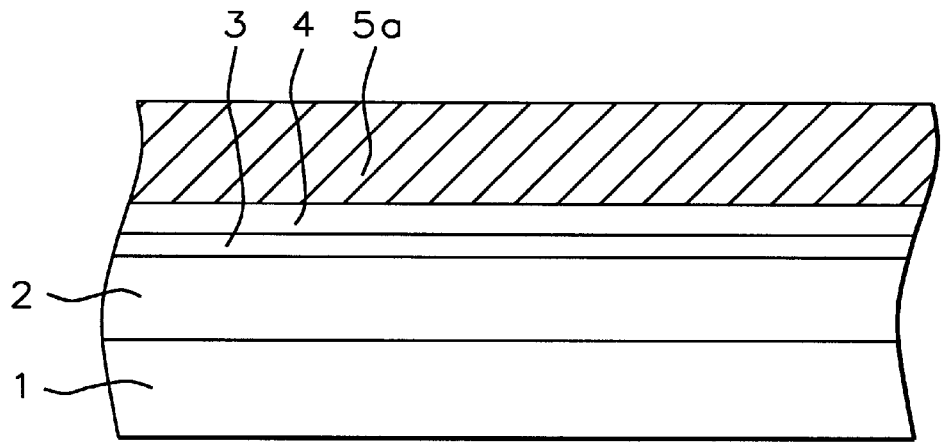

FIG. 1, schematically shows the initial stages of forming a metal interconnect structure. The invention will be described with the metal interconnect formed on an underlying insulator layer, however contacts to underlying, and overlying conductive regions, not shown in the drawings, are also accomplished during the identical process, used and shown overlying an insulator layer. A semiconductor substrate 1, and an insulator layer 2, are shown schematically in FIG. 1. Insulator layer 2, can be a silicon oxide layer, a silicon nitride layer, a borophosphosilicate layer, or a phosphosilicate layer. A layer of titanium nitride 3, is deposited using chemical vapor deposition, (CVD), procedures, at a temperature between about 200 to 450° C., to a thickness between about 100 to 500 Angstroms. Titanium nitride layer 3, will serve as a barrier layer, for a subsequent, overlying copper layer, preventing copper from reaching, via diffusion, underlying regions, such as insulator layer 2, or device regions, located in semiconductor substrate 1. A cluster type, PVD/CVD tool, is used for deposition of titanium nitride layer 3, with the cluster type tool also possessing the capability for deposition of a subsequent germanium layer, and for a subsequent copper layer, all in situ, without exposing the wafer to the environment. The cluster tool can be entirely a CVD type, entirely a PVD type, or the cluster tool can be a PVD/CVD mix. A germanium layer 4, is next deposited in the cluster PVD/CVD tool, at a temperature between about 200 to 450° C., to a thickness between about 10 to 100 Angstroms, using $GeH_4$ as an reactant. The thickness of germanium, which will translate to a specific $Cu_3Ge$ thickness, is critical in achieving desired adhesion between a subsequent copper layer, and underlying materials. Finally a copper layer 5a, is deposited, again using the cluster PVD/CVD tool for deposition, at a temperature between about 150 to 450° C., to a thickness between about 200 to 1500 Angstroms, using Cu hfac-TMVS as reactants. The titanium nitride, germanium, and copper layers can be deposited using physical vapor deposition. The result of these depositions are schematically shown in FIG. 1.

Figure 2:
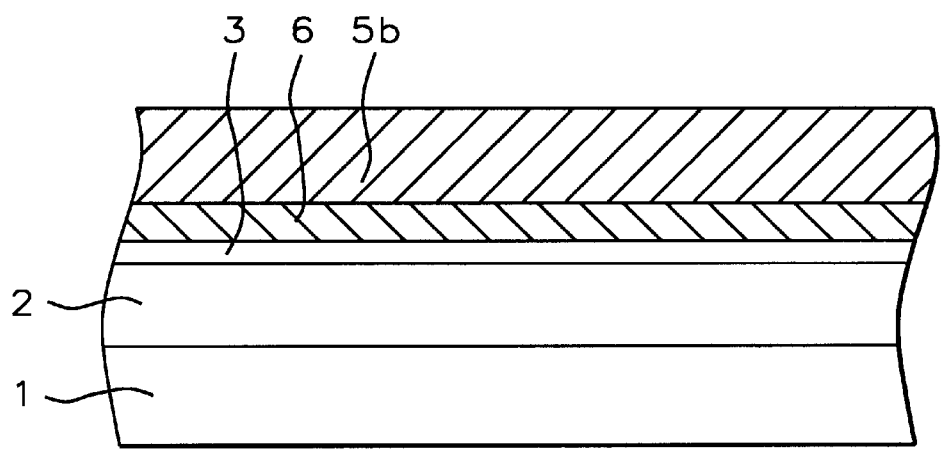
Figure 3:
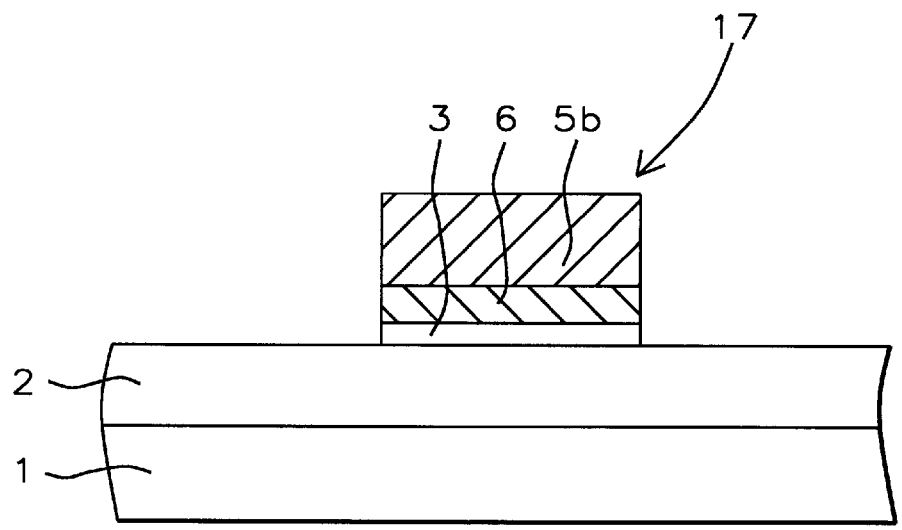

A critical anneal procedure is next performed using conventional furnace, or using rapid thermal anneal (RTA), procedures, at a temperature between about 150 to 450° C., in either an hydrogen, hydrogen—nitrogen environment, or in vacuum, for a time between about 0.5 to 30 min, creating $Cu_3Ge$ intermetallic layer 6, schematically shown in FIG. 2. The anneal procedure is needed if the copper layer was deposited at a temperature below 150° C. If the copper layer is deposited at a temperature greater than 150° C., the $Cu_3Ge$ layer will be formed in situ, during deposition, eliminating the need of the anneal procedure. The formation of $Cu_3Ge$ intermetallic layer 6, consumes all of germanium layer 4, and a portion of initial copper layer 5a, resulting in the thinner copper layer 5b. The $Cu_3Ge$ intermetallic layer 6, is formed to a thickness between about 15 to 150 Angstroms, and provides an adhesion layer for the subsequent interconnect structure, improving the adhesion between copper layer 5b, and underlying materials such as titanium nitride layer 3. In addition, $Cu_3Ge$ has a resistivity between about 5 to 6E-6 ohm-cm, thus providing additional conductive contributions to the interconnect structure. Other possible adhesive layer candidates, such as CuTi, do not offer as low a resistivity as $Cu_3Ge$, and thus do not offer the high conductivity advantage offered using this invention, featuring a $Cu_3Ge$ adhesion layer. FIG. 3, schematically shows the metal interconnect structure 17, comprised of copper layer 5b, $Cu_3Ge$ intermetallic layer 6, and titanium nitride layer 3, after patterning, accomplished using photolithographic and reactive ion etching procedures, using $Cl_2$ as an etchant. A copper damascene procedure, can be used in place of the photolithographic and RIE patterning procedure, if desired.

Figure 4:
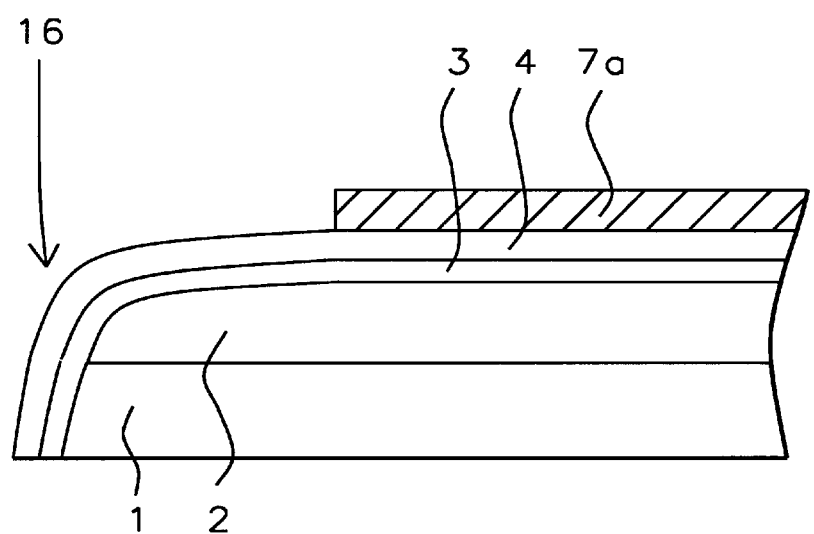
Figure 5:
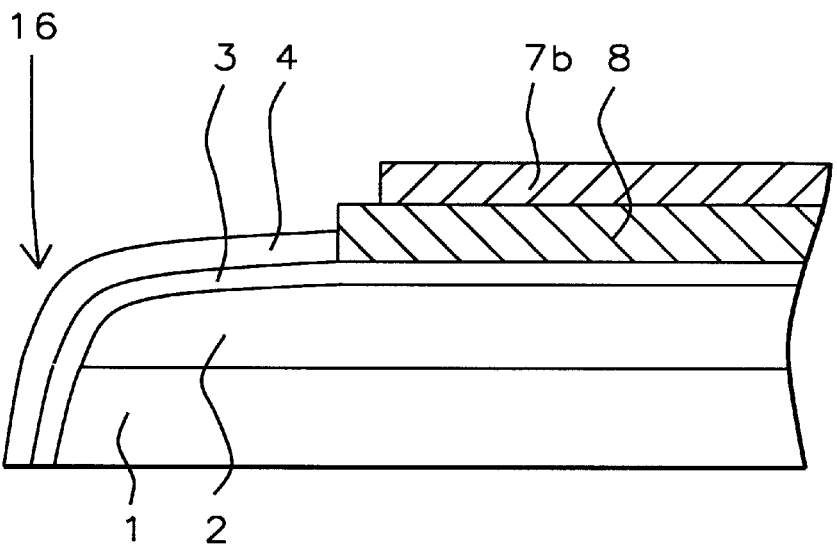
Figure 6:
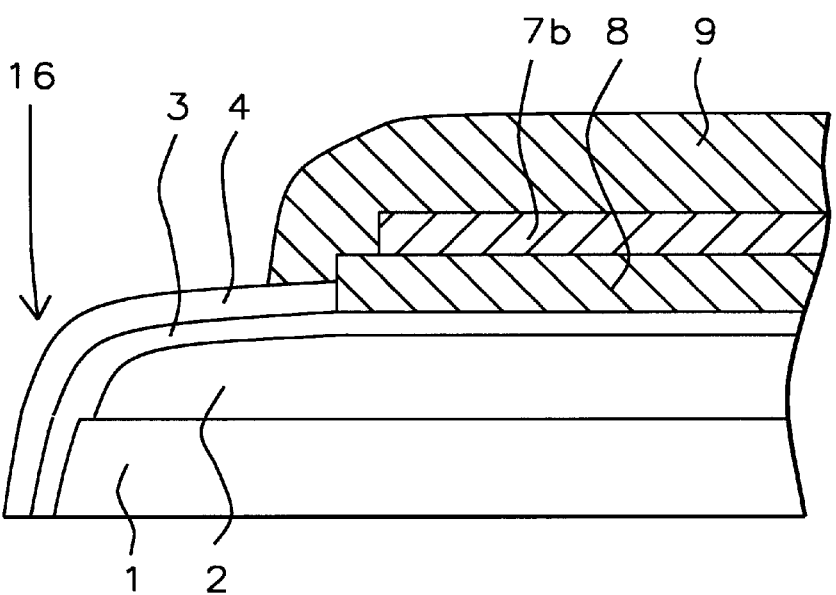

A second embodiment of this invention is next described, and shown schematically in FIGS. 4–6. If an electrochemical deposition, (ECD), procedure, is desired for achieving the copper component of an interconnect structure, still utilizing the low resistivity, $Cu_3Ge$ adhesion layer, care must be taken not to plate copper on the beveled sides of a silicon wafer, during the ECD, or plating operation. The presence of copper on the beveled edges of a silicon wafer, when in contact with apparatus used for subsequent process steps, can result in copper contamination of this apparatus. Therefore a sequence, shown schematically in FIGS. 4–6, is used, to prevent copper from forming on the beveled edges of a silicon wafer. FIG. 4, shows the beveled edge 16, of a silicon wafer. Again as previously shown a cluster PVD/CVD tool is used to deposit titanium nitride layer 3, at a thickness between about 100 to 500 Angstroms, and germanium layer 4, at a thickness between about 10 to 100 Angstroms. However for this embodiment, a copper seed layer 7a, thinner than copper layer 5a, previously shown in FIG. 1, is deposited in the cluster PVD/CVD tool, at a temperature between about 150 to 450° C., to a thickness between about 200 to 1500 Angstroms, using copper htac-TMVS as reactants. Copper seed layer 7a, is not extended to a region near beveled edge 16, exposing the top surface of germanium layer 4, in that region. This is schematically shown in FIG. 4. The use of a clamp ring, placed along the edge of the wafer, prevents deposition of copper seed layer 7a, in the region near the beveled edge.

An anneal cycle, again accomplished using RTA or conventional furnace procedures, at a temperature between about 150 to 450° C., for a time between about 0.5 to 30 min., in either a hydrogen, or a hydrogen-nitrogen ambient, or in vacuum, is used to form $Cu_3Ge$ layer 8, schematically shown in FIG. 5. $Cu_3Ge$ is only formed in a region in which copper seed layer 7a, existed, overlying germanium layer 4, therefore not forming in the vicinity of the beveled edge 16. The formation of $Cu_3Ge$ layer 8, to a thickness between about 15 to 150 Angstroms, consumes a portion of copper seed layer 7a, resulting in a thinner, copper seed layer 7b, between about 15 to 150 Angstroms in thickness. The reaction also consumes the total thickness of germanium layer 4, in regions in which germanium layer 4, was located underlying copper seed layer 7a. The resistivity of $Cu_3Ge$ layer 8, again to be used as an adhesive layer for the subsequent copper component, of a conductive interconnect structure, is between about 5 to 6E-6 ohm -cm.

An ECD procedure, is next used to plate a thick copper layer 9, on the exposed surface of thin, copper seed layer 7b. Since thin, copper seed layer 7b, was previously formed, in a region away from beveled edge 16, thick copper layer 9, will not plate on the exposed surface of germanium layer 4, near, or at, beveled edge 16, and thus not provide a source for subsequent copper contamination of processing apparatus and equipment. Thick copper layer 9, is formed to a thickness between about 3000 to 15000 Angstroms, using dissociation and reduction of copper sulfate at, or near about 30° C., at atmospheric pressure. The deposition rate of the ECD procedure is between about 2000 to 6000 Angstroms/min. The result of this procedure is schematically shown in FIG. 6. The composite metal layer of copper-$Cu_3Ge$-titanium nitride, is patterned using either a copper damascene, (copper chemical mechanical polishing), procedure, or using conventional photolithographic and reactive ion etching procedures, using $Cl_2$ as an etchant, creating a conductive, interconnect structure, identical to the metal interconnect structure previously shown in FIG. 3, of the first embodiment.

While this invention has been particularly shown and described with reference to the preferred embodiments thereof, it will be understood by those skilled in the art that various changes in form and details may be made without departing from the spirit and the scope of this invention.

What is claimed is:

1. A method for forming a metal interconnect structure, on a semiconductor substrate, comprising the steps of:

providing a insulator layer, on said semiconductor substrate, with openings in said insulator layer, exposing underlying conductive elements;

depositing a barrier layer;

depositing a germanium layer;

depositing a copper layer;

annealing to form a $Cu_3Ge$, intermetallic layer, between a top portion of said copper layer, and said barrier layer, with the formation of said intermetallic layer consuming all of said germanium layer, and consuming a bottom portion of said copper layer; and patterning of said top portion of said copper layer, of said $Cu_3Ge$ intermetallic layer, and of said barrier layer, via dry etching procedures, or via a copper chemical mechanical polishing procedure, to form said metal interconnect structure.

2. The method of claim 1, wherein said underlying conductive elements are active device regions in said semiconductor substrate.

3. The method of claim 1, wherein said underlying conductive elements are conductive plugs, used for contact to active device regions in said semiconductor substrate, or used to contact other metal interconnect structures.

4. The method of claim 1, wherein said barrier layer is titanium nitride, deposited using CVD procedures, at a temperature between about 200 to 450° C., to a thickness between about 100 to 500 Angstroms.

5. The method of claim 1, wherein said germanium layer is deposited using CVD procedures, at a temperature between about 200 to 450° C., to a thickness between about 10 to 100 Angstroms, using $GeH_4$ as a source.

6. The method of claim 1, wherein said copper layer is deposited using CVD procedures, at a temperature between about 150 to 450° C., to a thickness between about 200 to 1500 Angstroms, using copper hfac-TMVS as reactants.

7. The method of claim 1, wherein said $Cu_3$ Ge intermetallic layer is formed via an anneal procedure, performed using rapid thermal anneal, or conventional furnace procedures, at a temperature between about 150 to 450° C., for a time between about 0.5 to 30 min, in either hydrogen, hydrogen-nitrogen, or in a vacuum.

8. The method of claim 1, wherein said $Cu_3Ge$ intermetallic layer is formed to a thickness between about 15 to 150 Angstroms, and with a resistivity between about 5 to 6E-6 ohm - cm.

9. A method for forming a metal interconnect structure, on a semiconductor substrate, comprised of a low resistivity $Cu_3Ge$ intermetallic layer, located between an underlying titanium nitride barrier layer, and an overlying copper layer, comprising the steps of:

providing an insulator layer, on said semiconductor substrate, with openings in said insulator layer, exposing underlying conductive elements;

depositing said titanium nitride barrier layer, in a CVD tool;

depositing a germanium layer, in said CVD tool;

depositing said copper layer, in said CVD tool;

forming said low resistivity $Cu_3Ge$ intermetallic layer, on said titanium nitride barrier layer, consuming said germanium layer, and consuming a bottom portion of said copper layer, via an anneal procedure, or forming said low resistivity $Cu_3Ge$ intermetallic layer, in situ, during deposition of said copper layer; and patterning of a top, unconsumed portion of said copper layer, of said $Cu_3Ge$ layer, and of said titanium nitride layer, via dry etching, or via copper chemical mechanical polishing procedures, to form said metal interconnect structure.

10. The method of claim 9, wherein said underlying conductive elements are active device regions in said semiconductor substrate.

11. The method of claim 9, wherein said underlying conductive elements are conductive plugs, used in turn to contact active device regions in said semiconductor substrate, or used to contact other metal interconnect structures.

12. The method of claim 9, wherein said CVD tool is a cluster type tool, used to deposit said titanium nitride layer, said germanium layer, and said copper layer, in situ, without exposure to the atmosphere between depositions.

13. The method of claim 9, wherein said titanium nitride barrier layer is deposited in said CVD tool, at a temperature between about 200 to 450° C., to a thickness between about 100 to 500 Angstroms.

14. The method of claim 9, wherein said germanium layer is deposited in said CVD tool, at a temperature between about 200 to 450° C., to a thickness between about 10 to 100 Angstroms, using $GeH_4$ as reactants.

15. The method of claim 9, wherein said copper layer is deposited in said CVD tool, at a temperature between about 150 to 450° C., to a thickness between about 200 to 1500 Angstroms, using copper-htac-TMVS as reactants.

16. The method of claim 9, wherein said $Cu_3Ge$ intermetallic layer is formed using an anneal procedure, where said $Cu_3Ge$ intermetallic layer was not formed in situ during deposition, and was formed via the use of using either rapid thermal annealing, or conventional furnace procedures, at a temperature between about 150 to 450° C., for a time between about 0.5 to 30 min., in either a hydrogen, or in a hydrogen—nitrogen ambient, or in vacuum.

17. The method of claim 9, wherein said $Cu_3Ge$ intermetallic layer is formed to a thickness between about 15 to 150 Angstroms, with a resistivity between about 5 to 6E-6 ohm-cm.

18. A method for forming a metal interconnect structure, on a semiconductor substrate, using a electrochemical deposited, copper layer, comprising the steps of:

providing an insulator layer, on said semiconductor substrate, with opening in said insulator layer exposing underlying conductive elements;

depositing a barrier layer;

depositing a germanium layer;

depositing a copper seed layer, with said copper seed layer not extending to a beveled edge of said semiconductor substrate, leaving said copper seed layer, on said germanium layer, only on the top surface of said semiconductor substrate;

annealing to form a $Cu_3Ge$ intermetallic layer, with said $C_3Ge$ intermetallic layer created from total consumption of said germanium layer, and from consumption of a bottom portion of overlying copper seed layer, resulting in a thinned, top portion of said copper seed layer, on said $Cu_3Ge$ intermetallic layer, on the top surface of said semiconductor substrate;

forming a thick copper layer on said thinned, top portion of said copper seed layer, on the top surface of said semiconductor substrate; and patterning, via dry etching, or via copper chemical mechanical polishing procedures, of said thick copper layer, said thinned, top portion of said copper seed layer, said $Cu_3Ge$ intermetallic layer, and said barrier layer, to form said metal interconnect structure.

19. The method of claim 18, wherein said barrier layer is titanium nitride, deposited using CVD procedures, at a temperature between about 200 to 450° C., to a thickness between about 100 to 500 Angstroms.

20. The method of claim 18, wherein said germanium layer is deposited using CVD procedures, at a temperature between about 200 to 450° C., to a thickness between about 10 to 100 Angstroms, using $GeH_4$ as a source.

21. The method of claim 18, wherein said copper seed layer is deposited using CVD procedures, at a temperature between about 150 to 450° C., to a thickness between about 200 to 1500 Angstroms, using copper-hfac-TMVS as reactants.

22. The method of claim 18, wherein said copper seed layer is not extended to the beveled edge of said semiconductor substrate, via use of a clamp ring, on said semiconductor substrate, during the deposition of said copper seed layer.

23. The method of claim 18, wherein said said $Cu_3Ge$ intermetallic layer is formed using either rapid thermal anneal, or conventional furnace procedures, at a temperature between about 150 to 450° C., to a thickness between about 15 to 150 Angstroms.

24. The method of claim 18, wherein said said $Cu_3Ge$ intermetallic layer is formed to a thickness between about 15 to 150 Angstroms, with a resistivity between about 5 to 6E-6 ohm - cm.

25. The method of claim 18, wherein said thinned, top portion of said copper seed layer has a thickness between about 15 to 150 Angstroms.

26. The method of claim 18, wherein said thick copper layer is formed using an electrochemical deposition procedure, to a thickness between about 3000 to 15000 Angstroms, using dissociation and reduction of copper sulfate at a temperature of about 30° C., at atmospheric pressure, with a deposition rate, for said thick copper layer, between about 2000 to 6000 Angstroms/min.

* * * * *